United States Patent
Ma

(10) Patent No.: US 7,405,146 B2
(45) Date of Patent: Jul. 29, 2008

(54) ELECTROPLATING METHOD BY TRANSMITTING ELECTRIC CURRENT FROM A BALL SIDE

(75) Inventor: Cheng-Kuo Ma, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 419 days.

(21) Appl. No.: 11/338,376

(22) Filed: Jan. 24, 2006

(65) Prior Publication Data

US 2007/0173052 A1 Jul. 26, 2007

(51) Int. Cl.
*H01L 21/445* (2006.01)

(52) U.S. Cl. ............ 438/614; 438/667; 438/677; 257/E21.597; 29/852; 205/125

(58) Field of Classification Search .......... 438/667
See application file for complete search history.

(56) References Cited

U.S. PATENT DOCUMENTS

| | | | | |
|---|---|---|---|---|
| 5,758,413 A | * | 6/1998 | Chong et al. | 29/852 |
| 5,879,568 A | * | 3/1999 | Urasaki et al. | 216/18 |
| 6,881,662 B2 | * | 4/2005 | Kung et al. | 438/629 |
| 7,151,050 B2 | * | 12/2006 | Hsu et al. | 438/614 |
| 7,230,318 B2 | * | 6/2007 | Kripesh et al. | 257/621 |
| 2005/0186790 A1 | * | 8/2005 | Kirby et al. | 438/667 |

* cited by examiner

*Primary Examiner*—Stephen W Smoot

(57) ABSTRACT

An electroplating method by transmitting electric current from a ball side is provided. In the electroplating method, the circuit layer is firstly formed on the bump side of the IC board, and the electric current is transmitted to the portion of the circuit layer uncovered by the insulating layer formed on the bump side from the electroplated metal layer on the ball side to form the protective layer (the electroplated gold layer) on the portion of the circuit layer. In such a way, the electroplated gold layer cannot be formed under the insulating layer formed on the bump side (attached with the chip) because the electroplated gold layer is formed after the insulating layer has been formed, and thereby the fall-off of the insulating layer from the electroplated gold layer will not happen. Therefore, the reliability of the products is enhanced.

7 Claims, 6 Drawing Sheets

ELECTROPLATING METHOD BY TRANSMITTING ELECTRIC CURRENT FROM A BALL SIDE

BACKGROUND OF THE INVENTION

1. Field of the Invention

The present invention relates generally to an electroplating method, and in particular to an electroplating method by transmitting electric current from a ball side.

2. The Prior Arts

Due to environmental concerns, the electronics industry is moving rapidly to develop the lead-free and even the halogen-free materials. The lead-free soldereing processes require a higher reflow temperature than tin/lead applications. An increased level of heat resistance for the IC board is required to meet the requirements for the reliability of it when lead-free solder material is used. Therefore, the problems caused by the high temperature process should be solved by the product packaging manufacturer.

In order to improve the electrical properties and reduce the noise, the Bus less technology was applied to the IC board. However, the electroplated nickle/gold layer in the wire bonding region is still needed to achieve good adhesion. Although the nickle/gold layer can be formed by the electroless nickel immersion gold (ENIG) technology in the wire bonding region, the reliability of it is not good. Therefore, the electroplated the nickel/gold layer can be formed in the wire bonding region by the gold plating process (GPP) without the plating lines. However, the solder mask will cover the electroplated nickel/gold layer because the nickel/gold layer has been formed by electroplating process before the solder mask application. However, the material property of the solder mask greatly differs from that of the gold layer, and thereby the adhesion between the solder mask and the gold layer is potentially poor. Therefore, when the demand for reliability and heat resistance of the IC board becomes stringent, the conventional manufacturing method is not sufficient.

Moreover, for the non-plating line (NPL) process, the drawbacks of it is that the process is complicated; the specific equipment is needed to electroplate a thin copper layer; and the etch parameters are difficult to be controlled after electroplating the thin copper layer, which can cause micro short problem.

Therefore, the present invention provides a method in which the solder mask application is done before electroplating the nickel/gold layer without the plating lines in order to solve the problems set forth above.

SUMMARY OF THE INVENTION

The objective of the present invention is to provide an electroplating method by transmitting electric current from a ball side. In this method, the circuit layer is firstly formed on the bump side, and then the electric current is transmitted from the electroplated metal layer on the ball side to the exposed portion of the top of the circuit layer covered by the insulating layer (the solder mask or photo resist) formed on the ball side, and thereby the protective layer (the electroplated gold) is formed on the portion of the top of the circuit. In such a way, the electroplated gold is formed after the insulating layer has formed so that the electroplated gold cannot be formed under the insulating layer on the bump side (attached with chip), and thereby the fall-off of the insulating layer from the electroplated gold. Layer will not happen. Therefore, the reliability of the products is enhanced.

To achieve the foregoing objective, the present invention provides an electroplating method by transmitting electric current from a ball side. In this method, the IC board is provided, and the electroplated layer is formed on the bump side, the ball side, and the walls of the through holes, wherein the bump side and the ball side are electrically connected to each other via the electroplated metal layer. Afterwards, the electroplated metal layer on the bump side is patterned to form the first circuit layer. Then, the insulating layer is formed on the bump side to expose a portion of the top of the first circuit. Finally, the electric current is transmitted from the electroplated metal layer on the ball side to the first circuit layer on the bump side to form the first protective layer on the exposed portion of the top of the first circuit layer.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENT

Figure 1A:
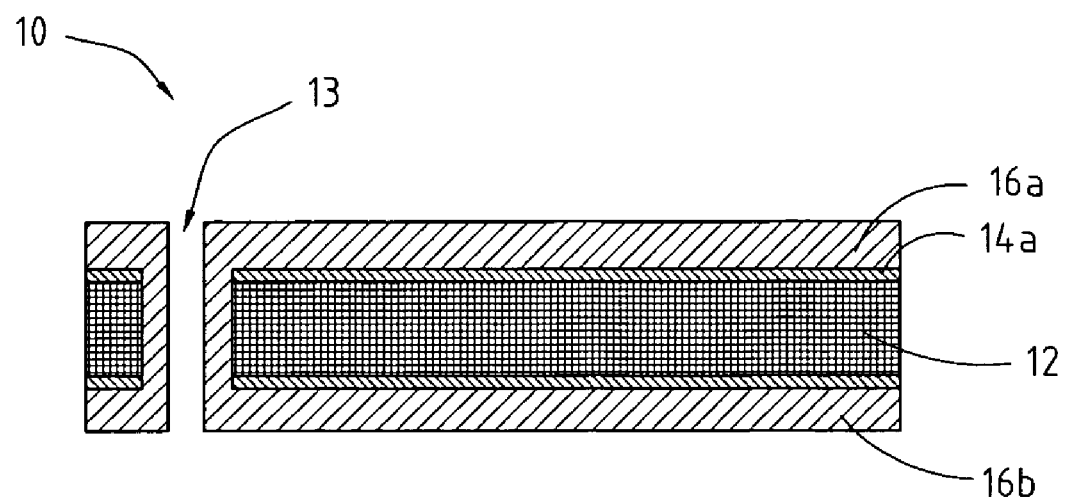
FIGS. 1A-1D are schematic views showing an electroplating method by transmitting electric current from a ball side in accordance with one embodiment of the present invention.
Figure 1B:
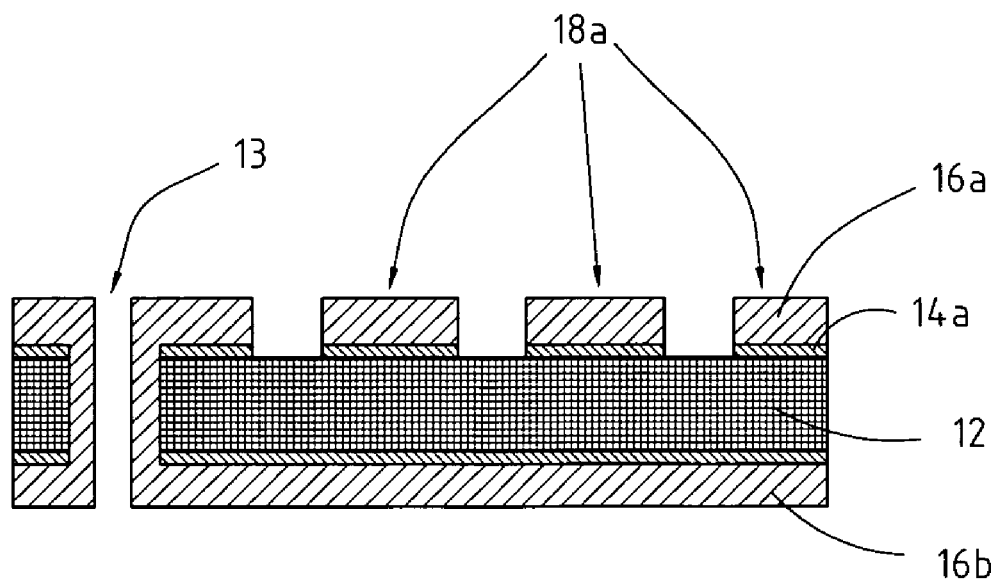
Figure 1C:
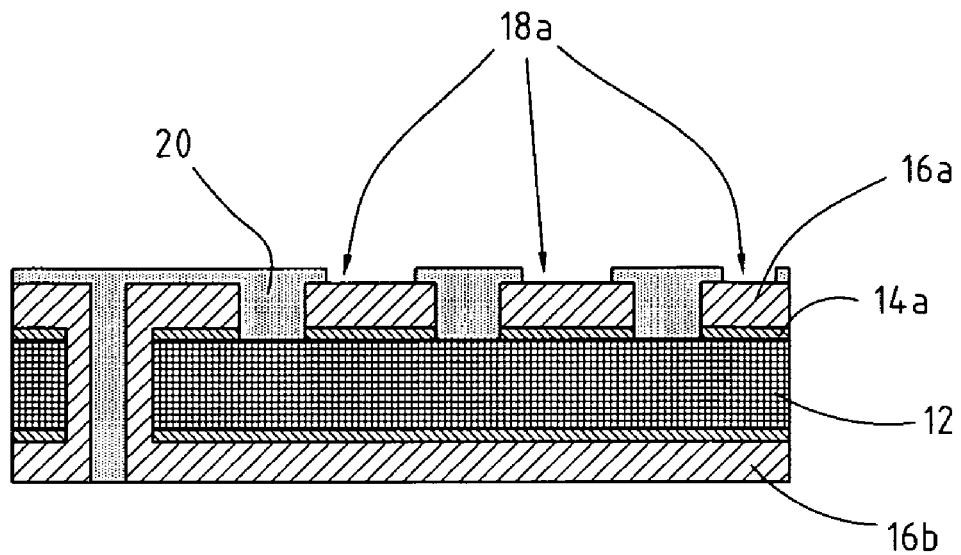
Figure 1D:
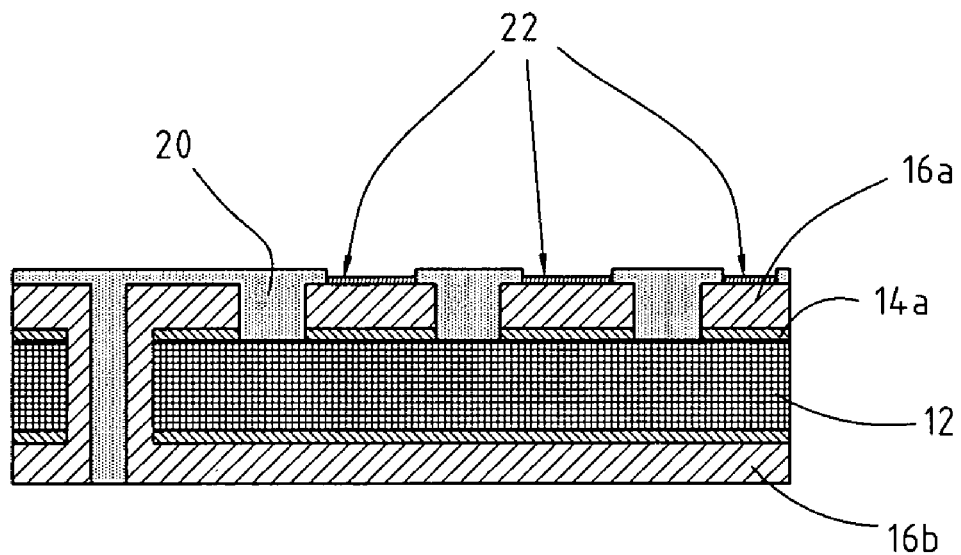
Figure 2A:
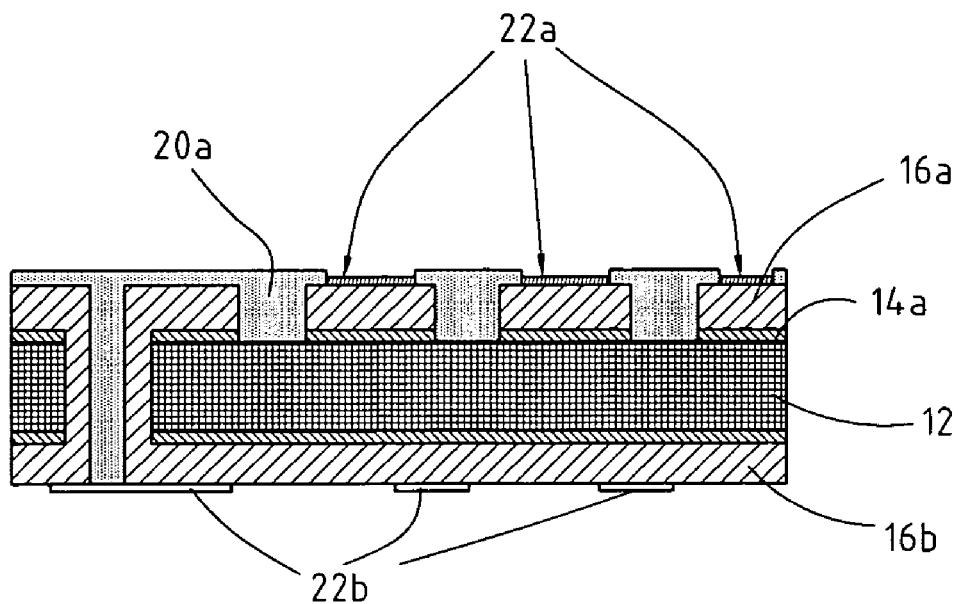
FIGS. 2A-2C are schematic views showing an electroplating method by transmitting electric current from a ball side in accordance with another embodiment of the present invention.

FIGS. 1A-1D are schematic views showing an electroplating method by transmitting electric current from a ball side in accordance with one embodiment of the present invention. As shown in FIG. 1A, the 1C board 10 is provided. In the IC board 10, a thin copper clad 14a is formed on the substrate 12, and the through hole 13 is formed in the IC board 10 by laser or mechanical drilling. The electroplated metal layer 16a, 16b is then formed on the bump side and the ball side of the IC board 10, and the wall of the through hole 13 in the IC board 10. In the electroplating method, the first circuit layer 18a is formed on the bump side as shown in FIG. 1B. Because the first circuit layer 18a is electrically connected to the electroplated metal layer 16b on the ball side, the first protective layer 22 (the electroplated gold layer) is formed on the exposed portion of the top of the first circuit layer 18a as shown in FIG. 1D by flowing an electric current from the electroplated metal layer 16b on the ball side to the first circuit layer 18a (which is covered by the patterned insulating layer 20, and only a portion of the top of the first circuit layer 18a is exposed) as shown in FIG. 1C. The die is then attached to the first circuit layer 18a on the bump side of the IC board as illustrated in the prior art. The electroplated gold layer 22 is formed after the insulating layer 20 has formed so that the electroplated gold layer 22 cannot be formed under the insulating layer 20 on the bump side (attached with a chip), and thereby the fall-off of the insulating layer from the electroplated gold layer will not happen. Therefore, the reliability of the products is enhanced. The first protective layer 22a, and the second protective layer 22b as shown in FIGS. 1D, 2A, and 3B can be an electroplated gold layer, an electroplated nickel layer, or any combination thereof. The first insulating layer 20a, and the second insulating layer 20b as shown in FIGS. 2A, and 3D can be solder mask. The third insulating layer 20c, and the fourth insulating layer 20d as shown in FIG. 3A can be photoresist. The second circuit 18b as shown in FIGS. 2C, and 3D can be formed on the ball side while the first circuit 18a is formed on the bump side. The method for fabricating the second circuit 18b as the insulating layer is a solder mask will be illustrated below. Then, the method for fabricating the second circuit 18b as the insulating layer 20 is a photoresist will be also illustrated below.

Figure 2B:
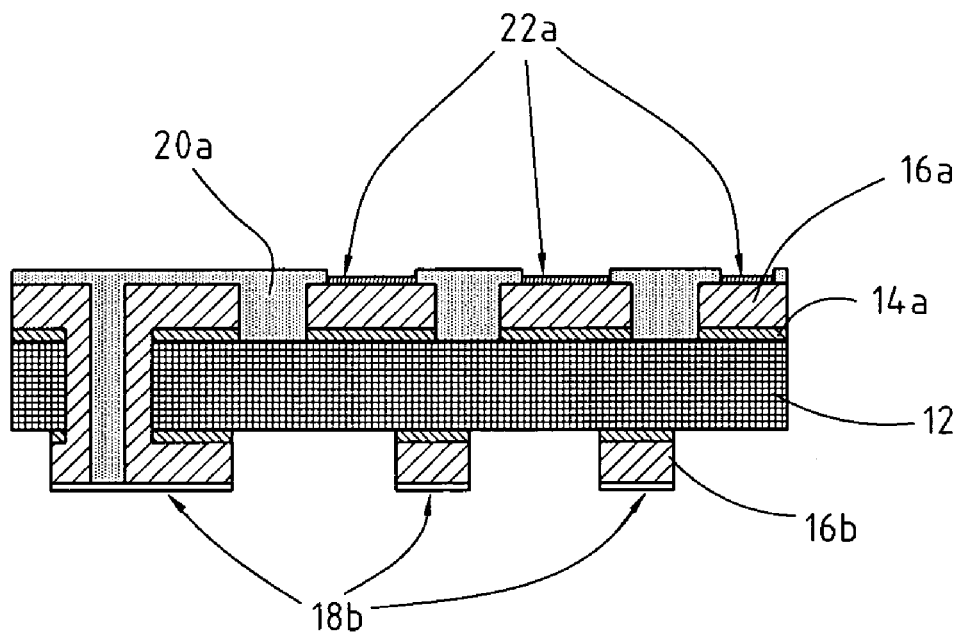
Figure 2C:
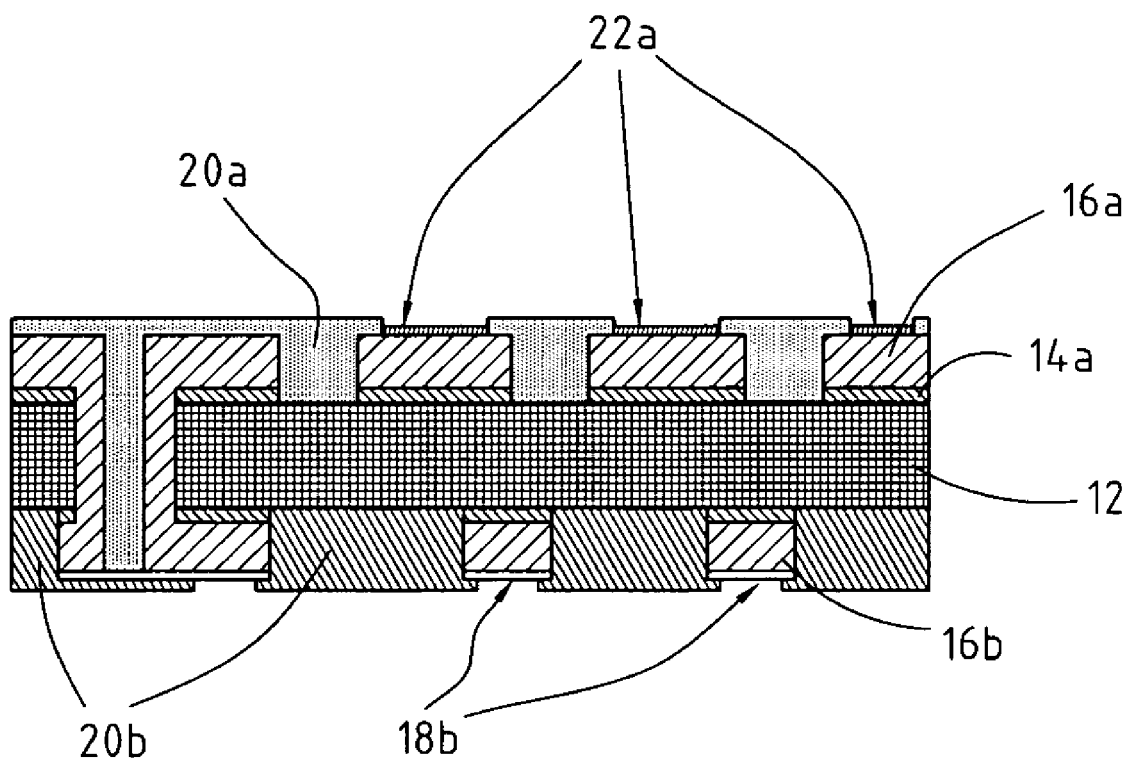
Figure 3A:
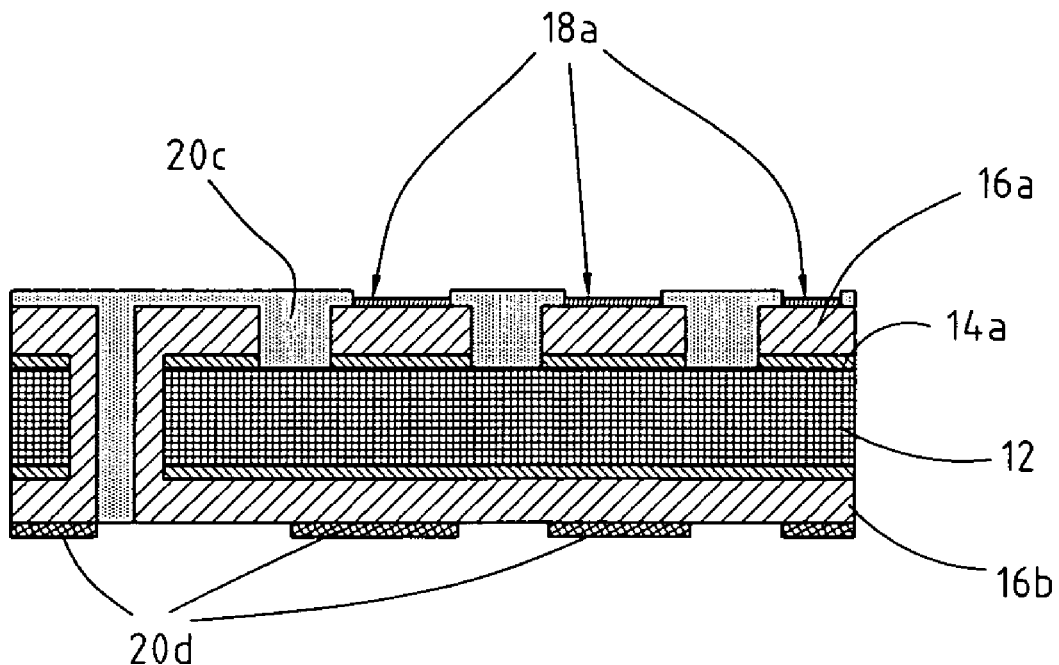
FIGS. 3A-3D are schematic views showing an electroplating method by transmitting electric current from a ball side in accordance with yet another embodiment of the present invention.
Figure 3B:
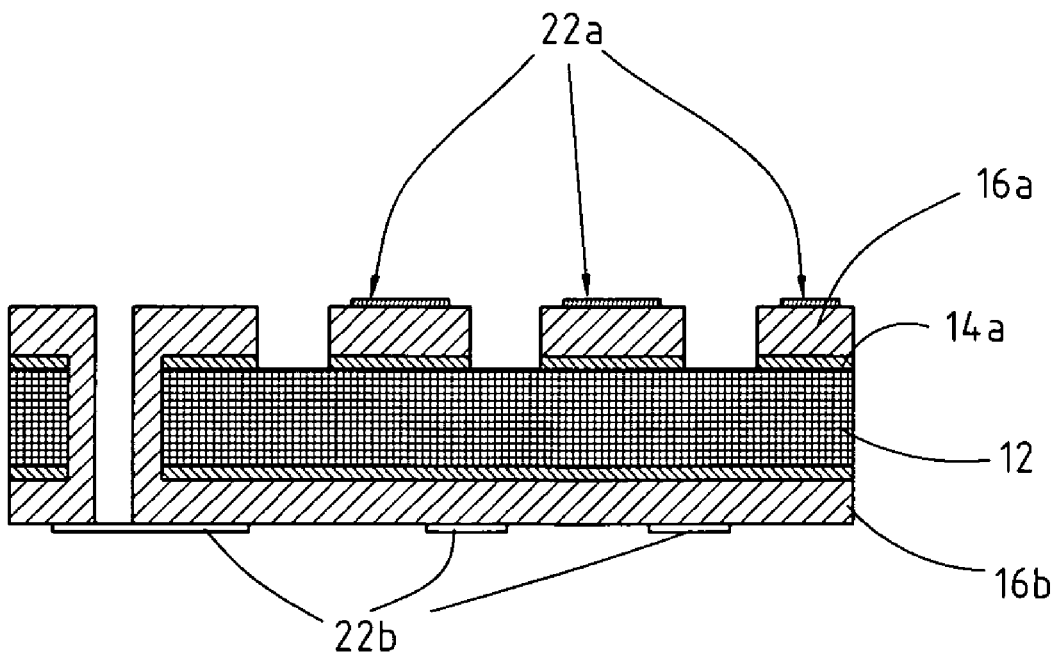

FIGS. 2A-2C are schematic views showing an electroplating method by transmitting electric current from a ball side in accordance with another embodiment of the present invention. Referring to FIGS. 2A-2C, the IC board 10, in which a substrate 12, a thin copper clad 14a, the electroplated metal layers 16a, 16b, the first circuit layer 18a, and the insulating layer 20 (i.e. the solder mask) has formed thereon, is provided. The patterned second protective layer 22b can be formed on the electroplated metal layer 16b on the ball side by electroplating process while the first protective layer 22 is formed on the first circuit 18a on the bump side as shown in FIG. 2A. The second circuit 18b is formed on the ball side by etching process by using the patterned second protective layer 22b as a mask as shown in FIG. 2B. In other words, the second circuit 18b is formed on the ball side by etching process taking the patterned second protective layer 22b as a photoresist. Finally, the second insulating layer 22b (the solder mask) is applied and defined by photolithographic techniques to uncover a portion of the top of the second circuit layer 18b as shown in FIG. 2C.

Figure 3C:
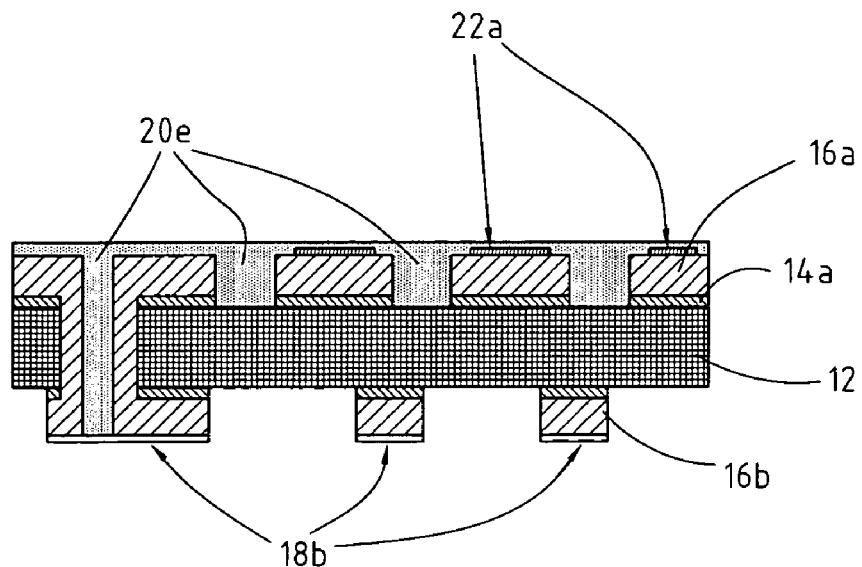
Figure 3D:
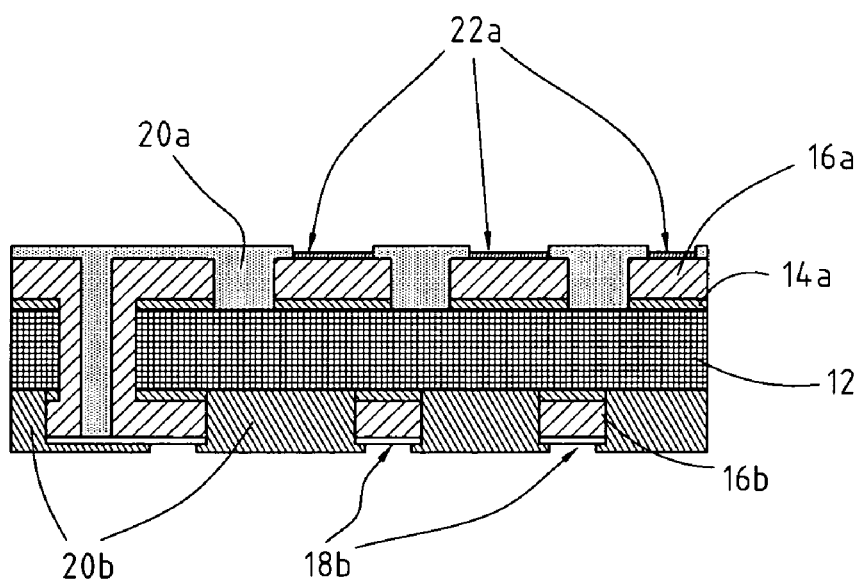

FIGS. 3A-3D are schematic views showing an electroplating method by transmitting electric current from a ball side in accordance with yet another embodiment of the present invention. Referring to FIGS. 3A-3D, the IC board 10, in which a substrate 12, a thin copper clad 14a, the electroplated metal layers 16a, 16b, the first circuit layer 18a has formed thereon, is provided. The patterned fourth insulating layer 20d (the photoresist) can be formed on the ball side while the third insulating layer 20c (the photoresist) is applied on the bump side and defined by photolithographic techniques to uncover a portion of the top of the first circuit layer 18a. The patterned second protective layer 22b can be formed on the portion of the electroplated metal layer 16b uncovered by the patterned fourth insulating layer 20d on the ball side while the first protective layer 22a is formed on the exposed portion of the top of the first circuit 18a on the bump side. Then, the third insulating layer 20c, the fourth insulating layer 20d are removed as shown in FIG. 3B. In order to form the second circuit layer 18b as shown in FIG. 3C, the dry film 20e is firstly formed on the bump side, and the second circuit layer 18b is then formed on the ball side by using the patterned second protective layer 22b as a mask. Finally, the second insulating layer 20b is applied and defined by photolithographic techniques to expose a portion of the top of the second circuit layer 18b after the dry film 20e has been removed as shown in FIG. 3D.

It will be apparent to those skilled in the art that various modifications and variations can be made in the present invention without departing from the spirit or scope of the present invention. Thus, it is intended that the present invention cover the modifications and the variations of this invention provided they come within the scope of the appended claims and their equivalents.

What is claimed is:

1. An electroplating method by transmitting an electric current from a ball side, comprising the steps of:
   providing an IC board having a bump side and a ball side, and a through hole being formed therein, an electroplated metal layer being formed on the bump side, the ball side, and a wall of the through hole, wherein the bump side, and the ball side are electrically connected to each other via the electroplated metal layer;
   patterning the electroplated metal layer formed on the bump side to form a first circuit layer, wherein the first circuit layer, and the electroplated metal layer formed on the ball side of the IC board are electrically connected to each other;
   forming an insulating layer on the bump side to expose a portion of a top of the first circuit layer; and
   forming a first protective layer on the exposed portion of the top of the first circuit layer by transmitting an electric current from the electroplated metal layer formed on the ball side to the first circuit layer formed on the bump side.

2. The method as claimed in claim 1, wherein the insulating layer is a solder mask, or a photoresist.

3. The method as claimed in claim 2, wherein the insulating layer is the photoresist, and the method further comprises the steps of:
   forming a patterned fourth insulating layer on the ball side while a third insulating layer is applied on the bump side and is defined by a photolithographic technique to expose a portion of the top of the first circuit layer; and
   forming a second protective layer on an exposed portion of the electroplated metal layer covered by the patterned fourth insulating layer on the ball side while forming the first protective layer on the exposed portion of the top of the first circuit layer on the bump side.

4. The method as claimed in claim 3, wherein a second circuit layer is formed on the ball side by using the patterned second protective layer as a mask.

5. The method as claimed in claim 1, further comprising the step of forming a patterned second protective layer on the electroplated metal layer on the ball side by electroplating process while forming the first protective layer on the exposed portion of the top of the first circuit layer on the bump side.

6. The method as claimed in claim 5, wherein a second circuit layer is formed on the ball side by using the patterned second protective layer as a mask.

7. The method as claimed in claim 5, wherein the first protective layer, and the second protective layer are an electroplated gold layer, an electroplated nickel layer, or combination thereof.

* * * * *